United States Patent
Crump et al.

(10) Patent No.: US 12,078,245 B2
(45) Date of Patent: Sep. 3, 2024

(54) FACE OF TENSIONER GUIDE OR ARM WITH PATTERN TO INFLUENCE CHAIN SYSTEM NVH PERFORMANCE

(71) Applicant: BorgWarner, Inc., Auburn Hills, MI (US)

(72) Inventors: Matthew W. Crump, Cortland, NY (US); Christopher Van Loon, Ithaca, NY (US); Timothy K. White, Sterling Heights, MI (US); Joseph P. Goodsell, Groton, NY (US)

(73) Assignee: BORGWARNER INC., Auburn Hills, MI (US)

( * ) Notice: Subject to any disclaimer, the term of this patent is extended or adjusted under 35 U.S.C. 154(b) by 0 days.

(21) Appl. No.: 17/828,418

(22) Filed: May 31, 2022

(65) Prior Publication Data
US 2023/0383819 A1    Nov. 30, 2023

(51) Int. Cl.
*F16H 7/08* (2006.01)
*G06F 30/17* (2020.01)

(52) U.S. Cl.
CPC ........... *F16H 7/0829* (2013.01); *G06F 30/17* (2020.01); *F16H 2007/081* (2013.01); *F16H 2007/084* (2013.01); *F16H 2007/0842* (2013.01); *F16H 2007/0872* (2013.01)

(58) Field of Classification Search
CPC ........ G06F 30/00; G06F 30/17; F16H 7/0829; F16H 2007/081; F16H 2007/084; F16H 2007/0842; F16H 2007/0872
USPC ............................................................ 703/1
See application file for complete search history.

(56) References Cited

U.S. PATENT DOCUMENTS

| | | |
|---|---|---|
| 1,579,681 A | 4/1926 | John |
| 1,892,067 A | 12/1932 | Douglas |
| 2,129,107 A | 9/1938 | Taylor |
| 2,191,946 A | 2/1940 | John |
| 2,210,276 A | 8/1940 | Bremer |
| 2,355,003 A | 8/1944 | Mccann |
| 3,334,524 A | 8/1967 | Chalk |
| 3,441,009 A | 4/1969 | Rafanelli |
| 3,455,178 A | 7/1969 | Ruoff et al. |
| 3,656,361 A | 4/1972 | Honda |
| 3,673,884 A | 7/1972 | Southiere |

(Continued)

FOREIGN PATENT DOCUMENTS

| | | |
|---|---|---|
| CN | 2859091 | 1/2007 |
| CN | 109667898 A * | 4/2019 |

(Continued)

OTHER PUBLICATIONS

Bonart, Jakob et al., "Enhancing End-of-Line Defect Classifications and Evaluating Early Testability for Inline Test Stands Using NVH Measurements", 2021, IEEE. (Year: 2021).*

(Continued)

*Primary Examiner* — Cedric Johnson
(74) *Attorney, Agent, or Firm* — Brown & Michaels, PC

(57) ABSTRACT

A pattern for application to the face of the tensioner arm, guide or snubber in contact with a chain to intentionally break up the chain contact force between the back of the chain links and the tensioner arm, guide or snubber face. This is done to prevent alignment with the chain related orders which are causing NVH within the chain system or to increase overall NVH to obscure chain related orders.

8 Claims, 14 Drawing Sheets

(56) References Cited

U.S. PATENT DOCUMENTS

| | | |
|---|---|---|
| 3,817,113 A | 6/1974 | Pfarrwaller |
| 4,069,719 A | 1/1978 | Cancilla |
| 4,337,055 A | 6/1982 | Mackay et al. |
| 4,457,741 A | 7/1984 | Hoeptner, III |
| 4,662,862 A | 5/1987 | Matson |
| 4,869,708 A | 9/1989 | Hoffmann et al. |
| 5,000,724 A | 3/1991 | Reid |
| 5,049,114 A | 9/1991 | Hayden |
| 5,122,098 A | 6/1992 | Kanehira |
| 5,180,340 A | 1/1993 | Vahabzadeh et al. |
| 5,234,381 A | 8/1993 | Vahabzadeh et al. |
| 5,286,234 A | 2/1994 | Young |
| 5,445,568 A | 8/1995 | Fukuzawa et al. |
| 5,524,725 A | 6/1996 | Schantzen |
| 5,730,674 A | 3/1998 | Ott |
| 5,776,024 A | 7/1998 | White et al. |
| 5,797,818 A | 8/1998 | Young |
| 5,846,150 A | 12/1998 | Wigsten |
| 5,961,411 A | 10/1999 | Tsutsumi et al. |
| 5,967,922 A | 10/1999 | Ullein et al. |
| 6,062,998 A | 5/2000 | Kumakura et al. |
| 6,117,034 A | 9/2000 | Vine |
| 6,129,644 A | 10/2000 | Inoue |
| 6,358,169 B1 | 3/2002 | Markley |
| 6,375,587 B1 | 4/2002 | Wigsten |
| 6,440,020 B1 | 8/2002 | Tada |
| 6,572,502 B1 | 6/2003 | Young et al. |
| 6,599,209 B1 | 7/2003 | Ullein et al. |
| 7,063,635 B2 | 6/2006 | Garcia |
| 7,597,640 B2 | 10/2009 | Markley et al. |
| 7,641,577 B2 | 1/2010 | Markley et al. |
| 8,348,792 B2 | 1/2013 | He |
| 8,900,079 B2 | 12/2014 | Mori et al. |
| 9,482,336 B2 | 11/2016 | Utaki |
| 9,534,516 B2 | 1/2017 | Utaki |
| 9,759,292 B2 | 9/2017 | Moura et al. |
| 9,797,483 B2 | 10/2017 | Kurono et al. |
| 10,612,630 B2 | 4/2020 | Konno et al. |
| 2002/0045503 A1 | 4/2002 | Young et al. |
| 2002/0115511 A1 | 8/2002 | Tada |
| 2003/0062015 A1 | 4/2003 | Garza |
| 2003/0228948 A1 | 12/2003 | Garbagnati et al. |
| 2004/0067806 A1 | 4/2004 | Markley et al. |
| 2005/0075204 A1 | 4/2005 | Cholewczynski |
| 2005/0107196 A1 | 5/2005 | Konno et al. |
| 2006/0100047 A1 | 5/2006 | Churchill et al. |
| 2006/0270502 A1 | 11/2006 | Markley et al. |
| 2006/0293134 A1 | 12/2006 | Markley et al. |
| 2007/0093328 A1 | 4/2007 | Markley |
| 2009/0111629 A1 | 4/2009 | Kobara et al. |
| 2009/0143177 A1 | 6/2009 | Nakano et al. |
| 2009/0275430 A1 | 11/2009 | Markley |
| 2009/0325750 A1 | 12/2009 | Wigsten et al. |
| 2010/0203991 A1 | 8/2010 | He |
| 2010/0210384 A1 | 8/2010 | Young et al. |
| 2010/0248876 A1 | 9/2010 | Kroon et al. |
| 2012/0129636 A1 | 5/2012 | Lee et al. |
| 2012/0225744 A1 | 9/2012 | Markley |
| 2013/0059686 A1 | 3/2013 | Markley et al. |
| 2013/0059687 A1 | 3/2013 | Markley |
| 2016/0102736 A1 | 4/2016 | Suchecki |
| 2016/0102738 A1 | 4/2016 | Vopelius-Feldt et al. |
| 2016/0186840 A1 | 6/2016 | Cipollone et al. |
| 2016/0265632 A1 | 9/2016 | Young et al. |
| 2017/0009849 A1 | 1/2017 | Stiglmaier et al. |
| 2017/0108111 A1 | 4/2017 | Steward et al. |
| 2017/0276216 A1 | 9/2017 | Perissinotto et al. |
| 2018/0163848 A1 | 6/2018 | Quinn et al. |
| 2018/0334928 A1 | 11/2018 | Yamauchi et al. |
| 2019/0003558 A1 | 1/2019 | Kumar et al. |
| 2019/0071286 A1 | 3/2019 | Dong et al. |
| 2019/0072175 A1 | 3/2019 | Klar et al. |
| 2020/0157976 A1 | 5/2020 | Takahashi et al. |
| 2021/0262552 A1 | 8/2021 | Seki et al. |
| 2022/0235852 A1* | 7/2022 | Crump .................... F16H 7/18 |
| 2022/0325783 A1 | 10/2022 | Schroeder et al. |

FOREIGN PATENT DOCUMENTS

| | | | |
|---|---|---|---|
| DE | 4327314 A1 | 2/1994 | |
| DE | 10014333 A1 | 3/2001 | |
| DE | 102006025890 A1 | 12/2007 | |
| DE | 112015002425 | 3/2017 | |
| DE | 112017000089 T5 * | 5/2018 | ............. F02B 67/06 |
| EP | 1070875 A3 | 4/2001 | |
| EP | 1164312 A3 | 6/2007 | |
| GB | 2206175 A | 12/1988 | |
| JP | S4993493 U | 8/1974 | |
| JP | S5121782 U | 2/1976 | |
| JP | S54133272 A | 10/1979 | |
| JP | S56173248 | 7/1985 | |
| JP | H03134351 A | 6/1991 | |
| JP | H06280608 A | 10/1994 | |
| JP | H07247858 A | 9/1995 | |
| JP | 2000274501 A | 10/2000 | |
| JP | 3383825 B2 | 3/2003 | |
| JP | 200428218 | 1/2004 | |
| JP | 2005042757 A | 2/2005 | |
| JP | 2005042779 A | 2/2005 | |
| JP | 2005075122 A | 3/2005 | |
| JP | 2006138471 A | 6/2006 | |
| JP | 2008143249 A | 6/2008 | |
| JP | 201213190 | 1/2012 | |
| JP | 2014066322 A | 4/2014 | |
| JP | 2019120243 A | 7/2019 | |
| WO | 2020068048 A1 | 4/2020 | |
| WO | 2020157457 A1 | 8/2020 | |

OTHER PUBLICATIONS

Cronwell, James C. et al., "Design, Construction and Instrumentation of a Machine to Measure Tension and Impact Forces in Roller Chain Drives", Feb. 27, 1995, Mech. Mach. Theory vol. 31, No. 4, Elsevier Science Ltd. (Year: 1995).*

\* cited by examiner

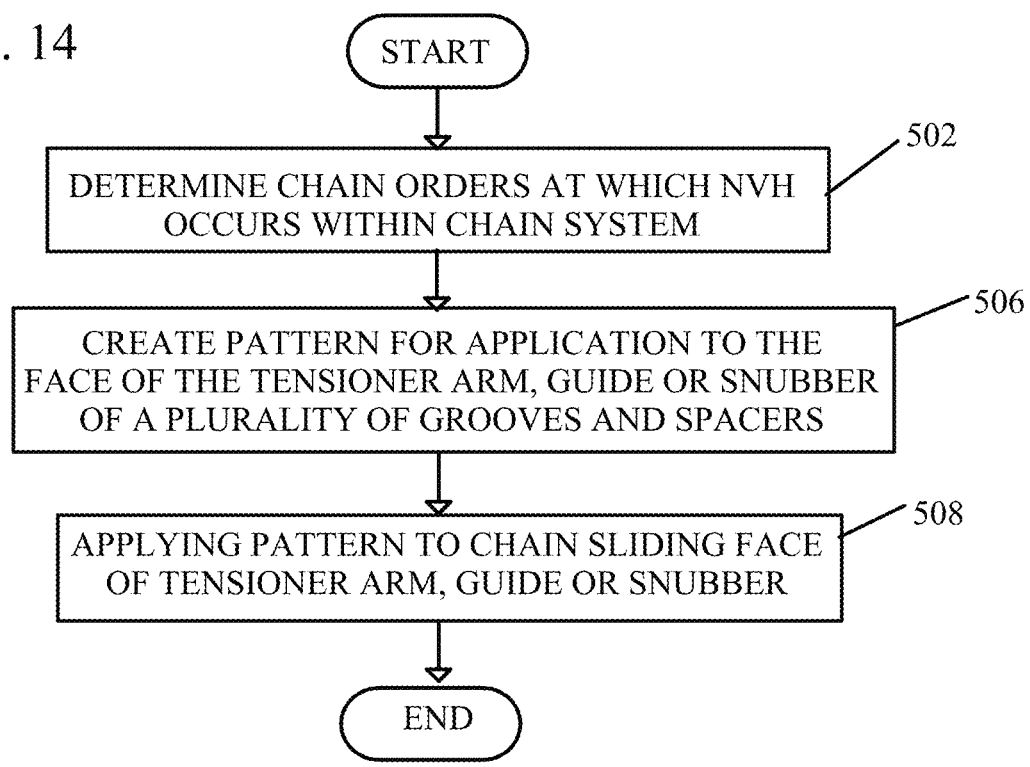

FACE OF TENSIONER GUIDE OR ARM WITH PATTERN TO INFLUENCE CHAIN SYSTEM NVH PERFORMANCE

BACKGROUND

The present invention relates to a face of tensioner arm, guide or snubber, and more specifically to a unique pattern applied to the face of the tensioner arm, guide or snubber to influence chain system noise, vibration harshness (NVH).

A chain or toothed belt drive is subjected to oscillating excitations. For example, a chain or toothed belt drive can be used between an engine crankshaft and camshaft. The oscillating excitation could be the torsional vibrations of the crankshaft and/or fluctuating torque loads from the valve train and/or a fuel pump.

Chain applications, either timing or drivetrain can require contact between the back of the chain and the face of a tensioner guide, arm or snubber to control chain motion. The contact between the chain and the face can result in engagement noise which can increase NVH, reducing perceived performance of the chain system. In particular, the chain-to-face contact forces can align with chain related orders, such as pitch frequency, causing additional excitations and unacceptable performance. Orders related to the number of events per shaft revolution is the number of events per unit of time.

NVH of the chain system is often caused by pitch orders, which is the noise associated with engagement of each link of the chain with sprockets and tensioners as well as the engagement differences which occur at half pitch and twice pitch orders due to the engagement differences from the links in guide row to the links in the non-guide row or flanks transitions along the teeth of the chain links of the chain. Pitch order equals the number of teeth on the drive sprocket. Therefore, if a drive sprocket has 40 teeth, then one sprocket revolution equals the $40^{th}$ order and is referred to as the pitch order. Frequency (Hz) can then be expressed as: (order number×rpm)/60.

FIG. 1 shows a conventional chain system 1. The chain system 1 has a driven sprocket 6 connected to a drive sprocket 2 via a toothed chain 8. The toothed chain 8 has a plurality of chain links 5 which are coupled together via coupling elements 7. The teeth 3 of the links 5 engage with the teeth driven sprocket 6 and the drive sprocket 2. A first tensioner 10 is present adjacent to the first strand 8a of the chain 8 to maintain tension on the first strand 8a and a second tensioner 12 is adjacent to the second strand 8b of the chain 8 to maintain tension on the second strand 8b. The tension is maintained through biased contact of the first and second tensioners 10, 12 on the backs of the links 5 at certain areas of the chain strands 8a, 8b, biasing the chain strands 8a, 8b towards each other.

FIG. 2 shows an example of a conventional first tensioner 10 or second tensioner 12. The tensioner 10, 12 has a mounting bracket 62 with a pivot axle 64 extending perpendicular therefrom. Parallel to the pivot axle 64 is a shaft 65 with a stop 69. The pivot axle 64 receives an arm 68. The arm 68 preferably has a single piece body 78 with a first end 68a, a second end 68b, and a smooth chain sliding surface 74, extending most of the body between the first end 68a and the second end 68b which interacts with chain strand 8a or chain strand 8b. More specifically, the chain sliding surface 74 interacts with the backs 9 of the chain links 5, which are opposite the teeth 3. The first end 68a of the body 78 has a hole (not shown) for receiving the pivot axle 64.

A torsion spring 66 is present between the mounting bracket 62 and acts to bias the arm 68 in a direction. One end 66a of the spring 66 is grounded relative to the mounting bracket 62 and the second end 66b of the spring 66 contacts the arm 68 to provide the bias force.

Other prior art includes dimples or slits to provide oil to a chain sliding surface to reduce friction between the chain links and the tensioner face or to guide the chain as the chain slides along the chain sliding surface. The prior art does not constitute any pattern that is actively controlling the alignment with the backs of the chain to decrease engagement at specific chain related orders to decrease NVH or to increase overall noise to obscure chain related orders that increase NVH.

SUMMARY

According to one embodiment of the present invention, a unique pattern is applied to the face of the tensioner arm, guide or snubber to intentionally break up the chain contact force between the back of the chain and the tensioner arm, guide or snubber face to prevent alignment with the chain related orders which are causing NVH within the chain system.

According to another embodiment of the present invention, the pattern applied to the face of the tensioner arm, guide or snubber face is applied to intentionally excite non-chain related orders of lesser noise magnitudes, therefore increasing the overall noise level to mask or obscure the orders causing significant NVH.

BRIEF DESCRIPTION OF THE DRAWINGS

FIG. 14 is a flow diagram of a method of applying a unique pattern to a face of a tensioner arm, guide or snubber to alter the NVH.

DETAILED DESCRIPTION

Figure 1:
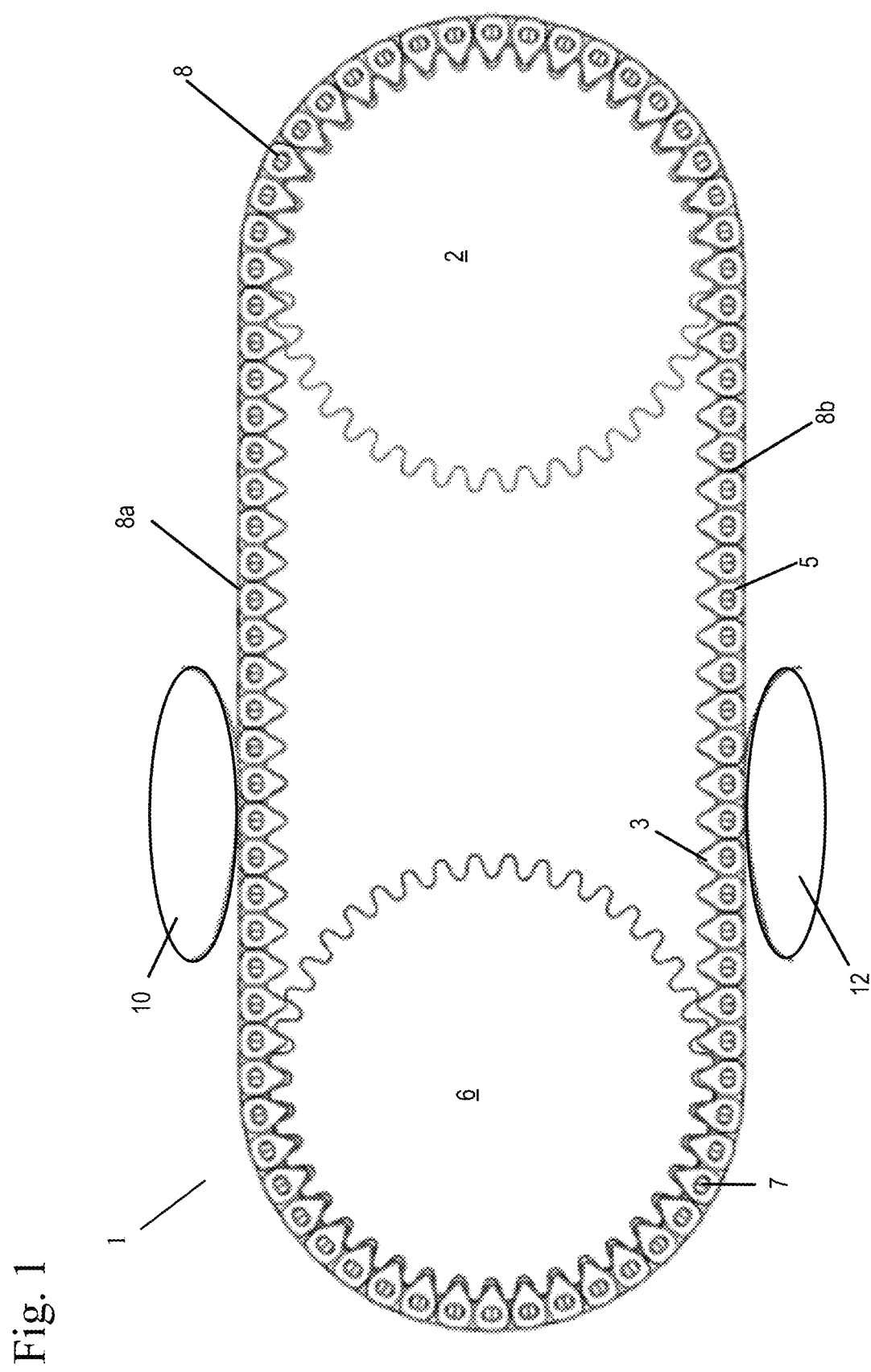
FIG. 1 shows a schematic of a chain drive system interacting with a tensioning face surface of a tensioner arm, guide or snubber.
Figure 2:
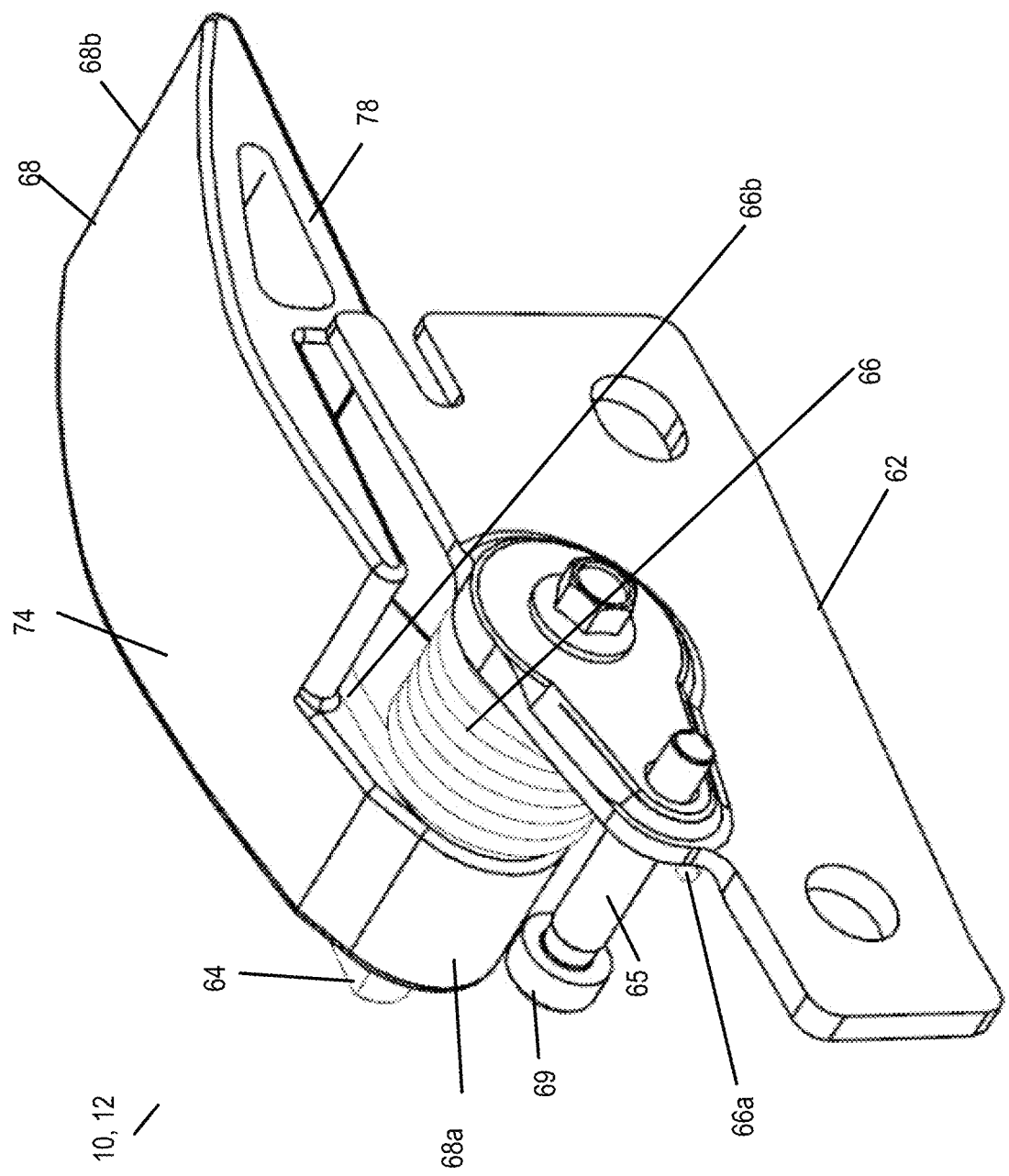
FIG. 2 shows a conventional tensioner arm for use with a chain drive system.
Figure 3:
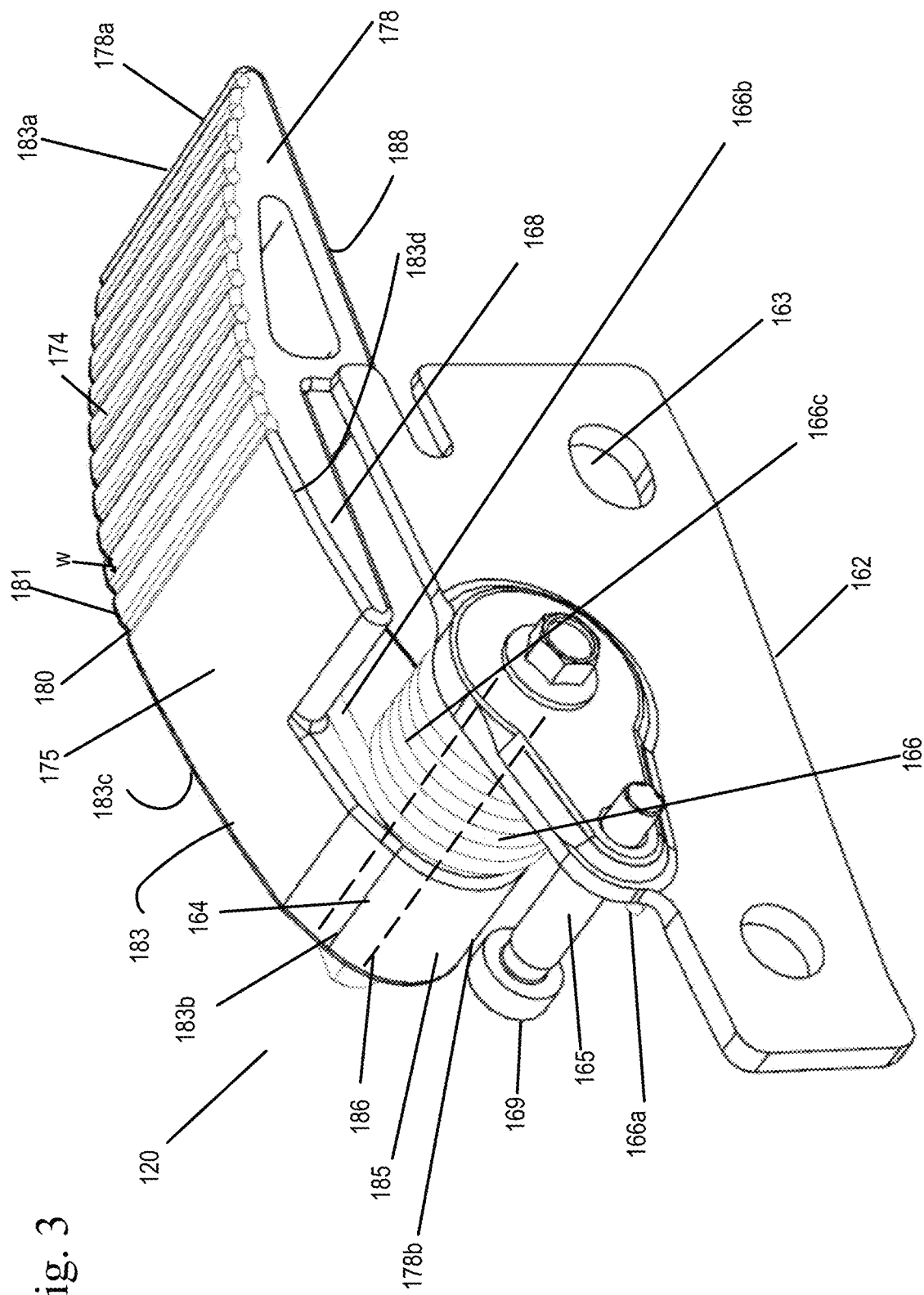
FIG. 3 shows an isometric view of a tensioner arm with a tensioning face with a pattern including straight grooves.
Figure 4:
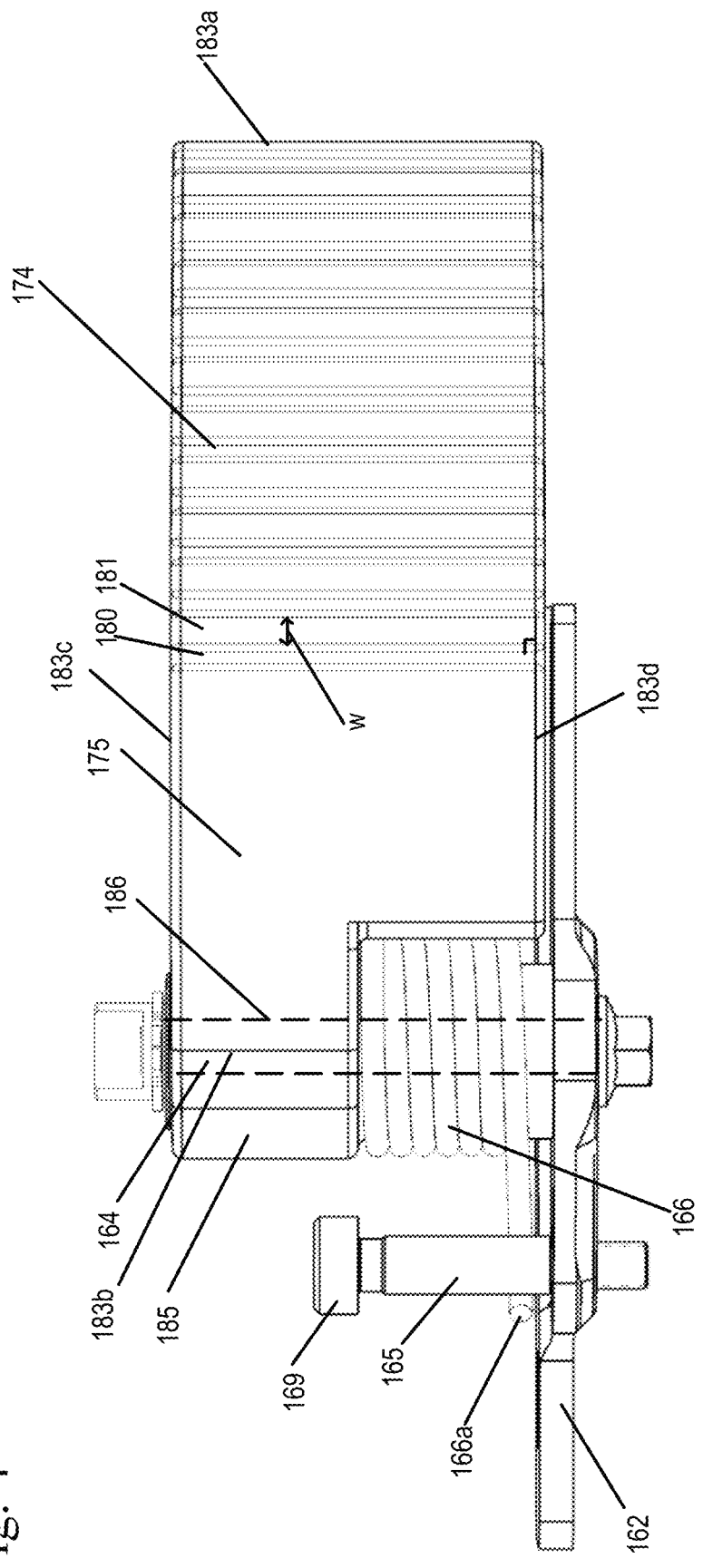
FIG. 4 shows a top view of the tensioner arm with a tensioning face with a pattern including straight grooves.

FIGS. 3-4 show a tensioner arm 120 with a pattern including straight grooves 180. A tensioner arm 120 is present adjacent to one or both chain strands 8a, 8b. Each tensioner arm 120 has a bracket 162 which is connected to a drivetrain case (not shown) via bolt holes 163. Extending perpendicularly from the mounting bracket 162 is a shaft 165 and a pivot axle 164. The shaft 165 is parallel to the pivot axle 164. The pivot axle 164 receives an arm 168 formed of a body 178 having a first end 178a and a second end 178b, a first surface 188 and a second surface 183, opposite the first surface 181. The second surface 183 is defined by a first end 183a, a second end 183b, a first side 183c, a second side 183d and an arcuate boss portion 185. The second surface 183 includes, from a first end 178a to a second end 178b, a chain sliding surface 174, a non-engagement surface 174, and a boss portion 185. The chain sliding surface 174 has a unique pattern of grooves 180 and spacers 181 which engage with or interact with the backs 5 of the chain links 7 of each of the chain strands 8a, 8b. The pattern includes a plurality of radial grooves 180 separated by a spacer 181 of a width w. In this embodiment, the width w of the spacer 180 is constant through the pattern. The grooves 181 extend between the first and the second side 183c, 183d and are straight, such that the grooves 181 are at a right angle relative to the first side 183c or the second side 183d. The number of grooves 180, spacers 181 and width w of the spacers 181 can vary. The width w of the spacers 181 spacing the grooves 180 apart and the number of grooves 180 intentionally break up the chain contact force between the back 5 of the chain links 7 of the chain strand 8a, 8b and the chain sliding face 174 of the tensioner arm 168 to prevent alignment with the chain related orders which are causing NVH within the chain system.

The non-engagement portion 175 of the second surface 183 does not engage with the chain strands 8a, 8b and extends into the boss portion 185 which defines a hole 186 for rotatably receiving the pivot axle 164.

In alternate embodiments, the body 178 of the arm 168 can be manufactured from multiple pieces.

The unique pattern and associated groove pattern spacing is preferably calculated using equation 1.1 and 1.2 shown below. The pattern engagement dimension is the width of the spacers between grooves.

$$\text{Pattern Engagement Dimension} \neq pn \quad (1.1)$$

$$\text{Pattern Engagement Dimension} \neq p(1/n) \quad (1.2)$$

Where:
p=Chain Pitch
n=any integer

Equations 1.1 and 1.2 are removing the pitch orders which are causing NVH of the chain system due to engagement of each link 7, and engagement differences from the guide to the non-guide row or flank transitions of links 7 of the chain 8 of the chain system.

Figure 8:
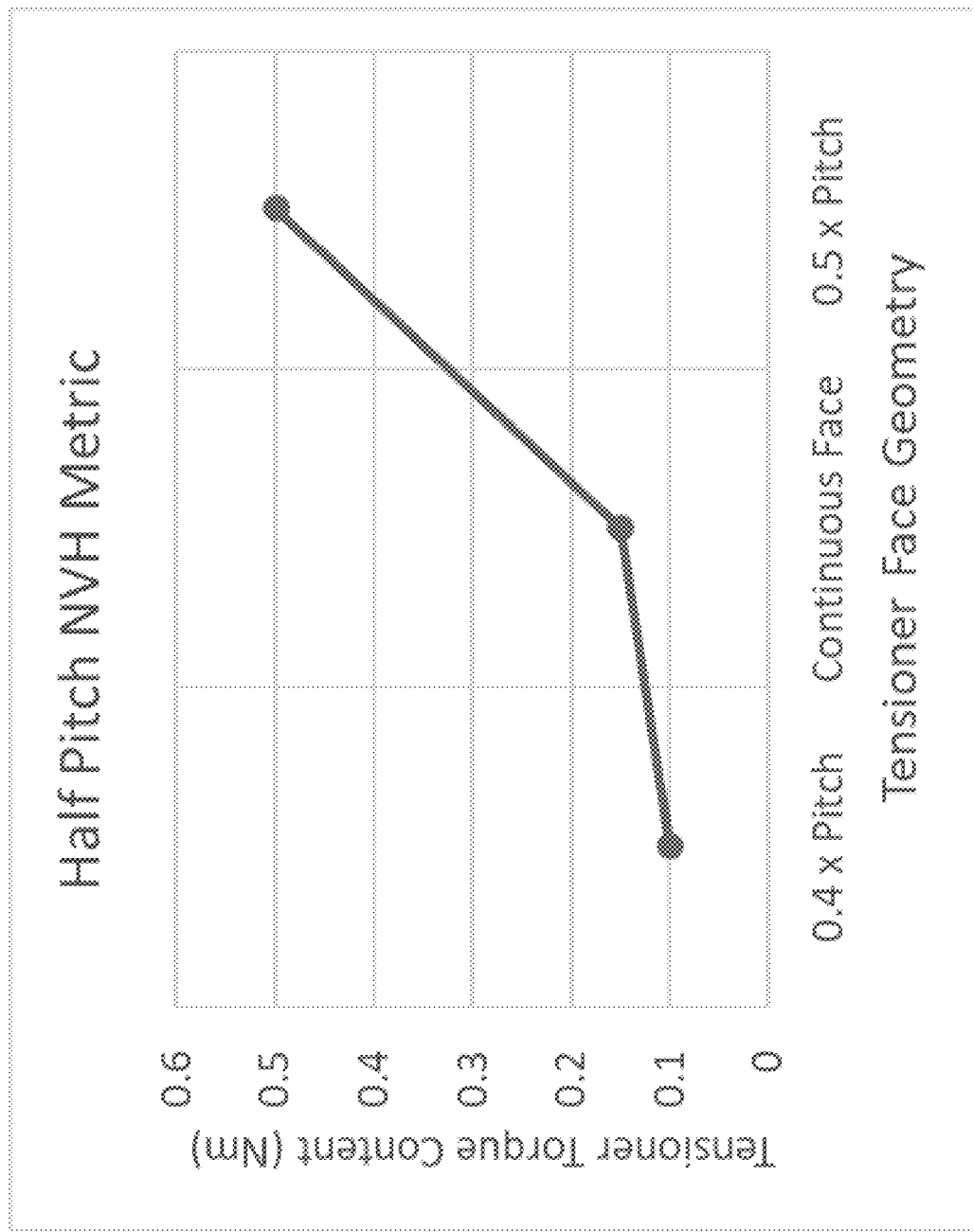
FIG. 8 shows a graph of half pitch frequency NVH metric of tensioner face geometry versus tensioner torque content.
Figure 9:
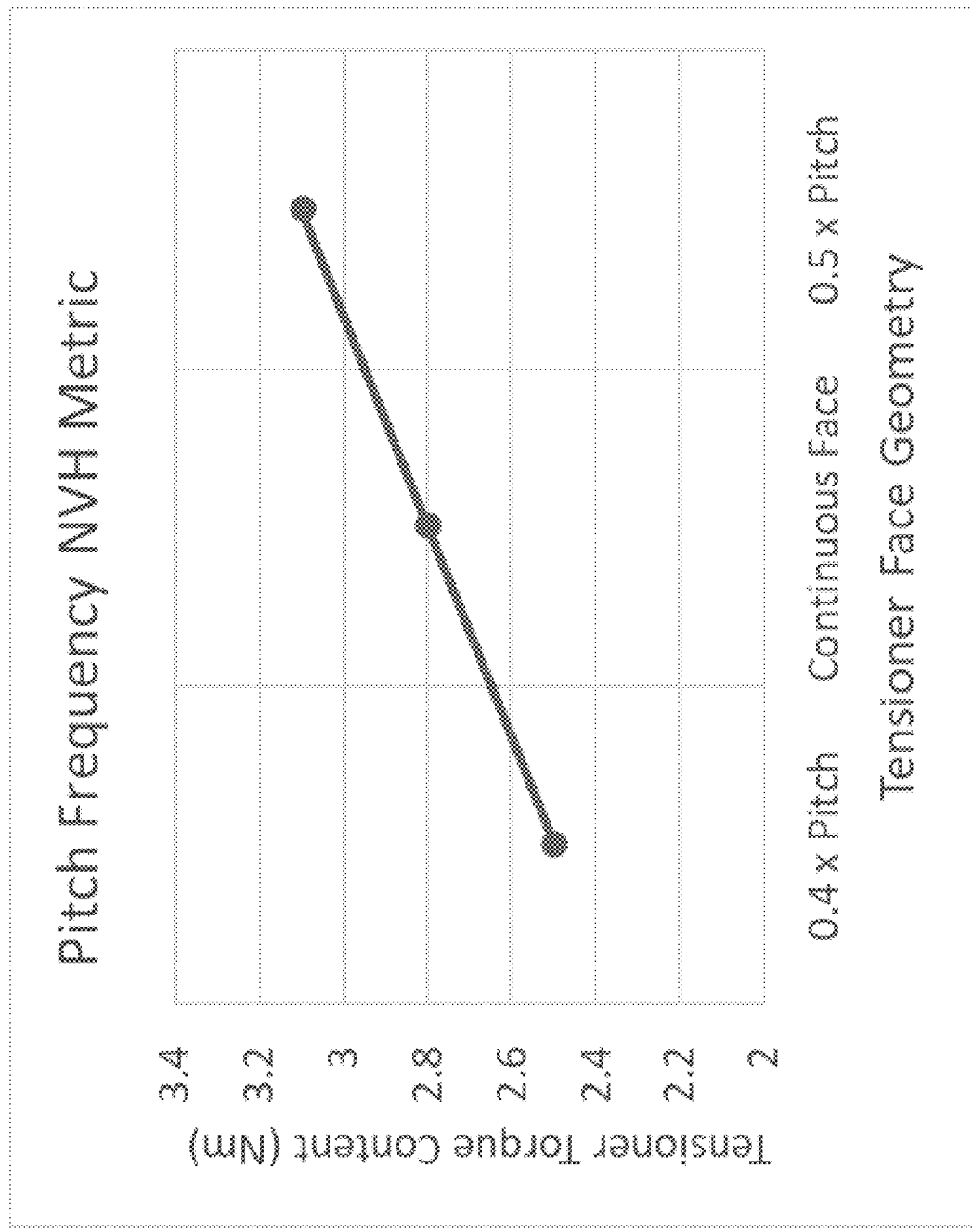
FIG. 9 shows a graph of pitch frequency NVH metric of tensioner face geometry versus tensioner torque content.
Figure 10:
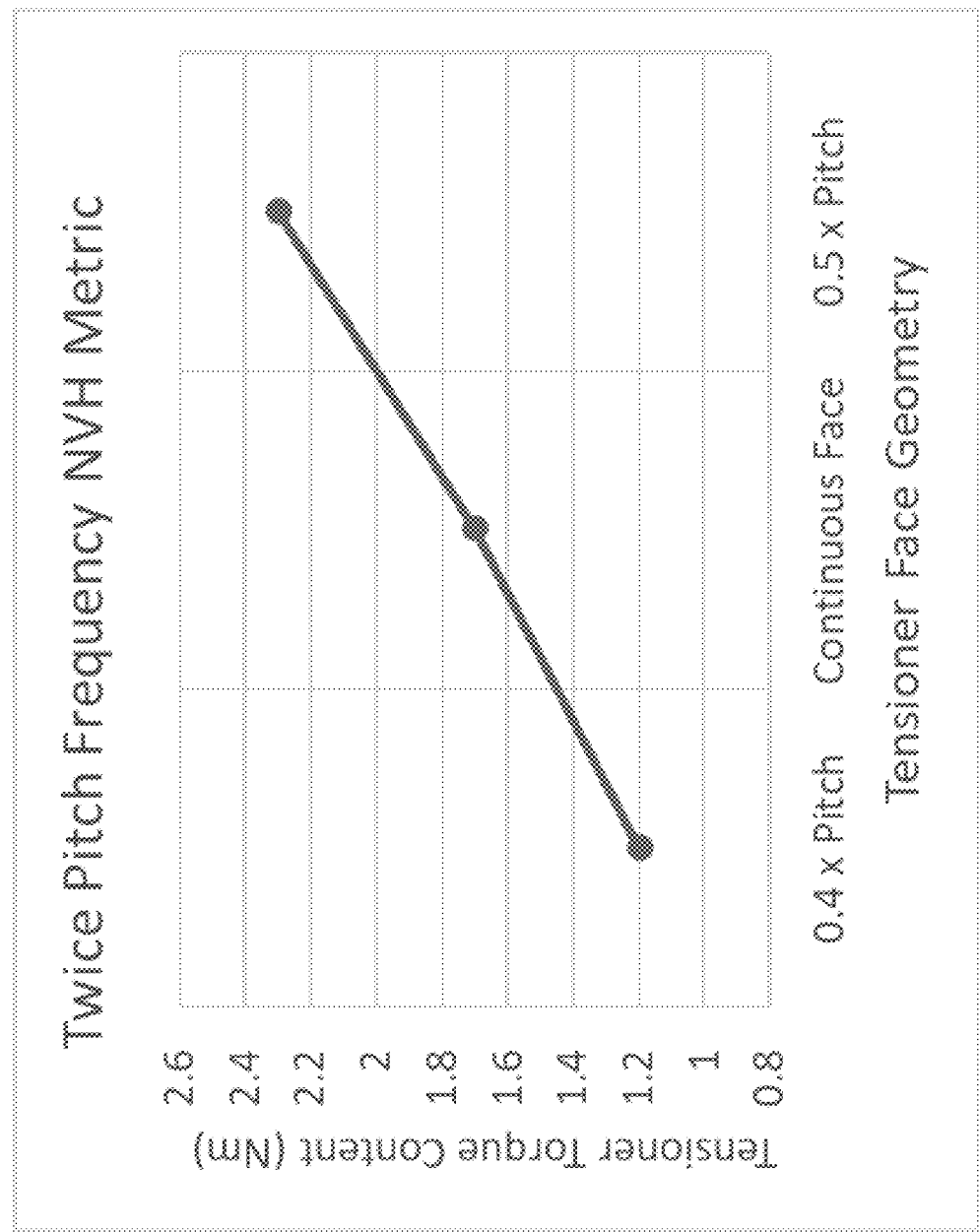
FIG. 10 shows a graph of twice pitch frequency NVH metric of tensioner face geometry versus tensioner torque content.

FIGS. 8-10 show examples of the tensioner face geometry including a smooth or continuous face 74 as in the prior art, an integer used with equations 1.1 and 1.2 to determine groove pattern spacing and a non-integer used to determine groove pattern spacing. For example, an integer of 2, results in $$p\left(\frac{1}{2}\right)$$

or p(0.5). In other words, the spacing between the groove 180 is set as 0.5×pitch of the chain. As shown in the half pitch NVH metric shown in FIG. 8, the continuous face with no grooves results in a tensioner torque content of 0.15 Nm, whereas using 0.5×pitch (integer of 2) results in a tensioner torque content of 0.5 Nm, which results in an increase in NVH performance which causes more NVH within the chain system then using a continuous face. A non-integer of 2.5 results in $$\text{Pattern Engagement Dimension} \neq p\left(\frac{1}{2.5}\right)$$

or p(0.4). Using 0.4×pitch results in a tensioner torque content of 0.1 Nm, which is less NVH than the continuous face and 0.5×pitch.

FIG. 9 shows pitch frequency NVH metric. At 0.4×pitch (non-integer of 2.5), the tensioner torque content is 2.5 Nm, the continuous face has a tensioner torque content of 2.8 Nm and 0.5×pitch (integer of 2) has a tensioner torque content of 3.1 Nm. Using a non-integer times the pitch results in less NVH than the continuous face and the integer×pitch.

FIG. 10 shows twice pitch frequency NVH metric. At 0.4×pitch (non-integer of 2.5), the tensioner torque content is 1.2 Nm, the continuous face has a tensioner torque content of 1.7 Nm and 0.5×pitch (integer of 2) has a tensioner torque content of 2.3 Nm. Using a non-integer times the pitch results in less NVH than the continuous face and the integer×pitch.

A torsion spring 166 is present between the mounting bracket 162 and the boss portion of the arm 185, adjacent to the non-engagement portion 174 of the second surface 183 and acts upon the arm 168 to bias the arm 168 towards the chain 8. One end 166a of the spring 166 is grounded relative to the mounting bracket 162 and the second end 166b of the spring 166 is grounded relative to the shaft 165. The coils 166c of the spring 166 are wrapped around the pivot axle 164 and present between the boss portion 185, the bracket 162 and second end 183b of the tensioner arm 168.

A stop 169 is present on the shaft 165 which can interact with the boss portion 185 of the arm 168 if the arm 168 pivots too far.

Figure 5:
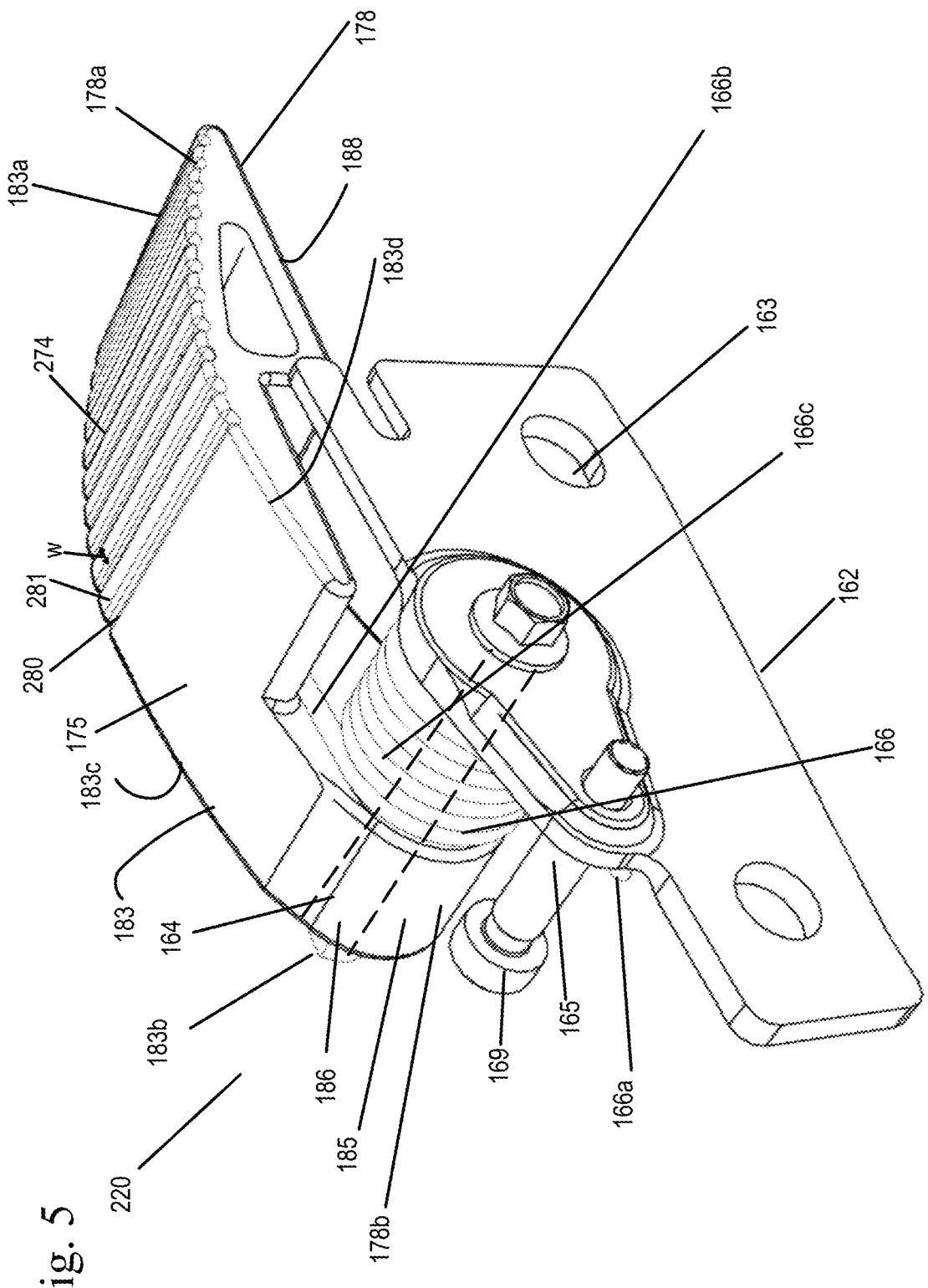
FIG. 5 shows an isometric view of a tensioner arm with a tensioning face with a pattern including diagonal grooves.
Figure 6:
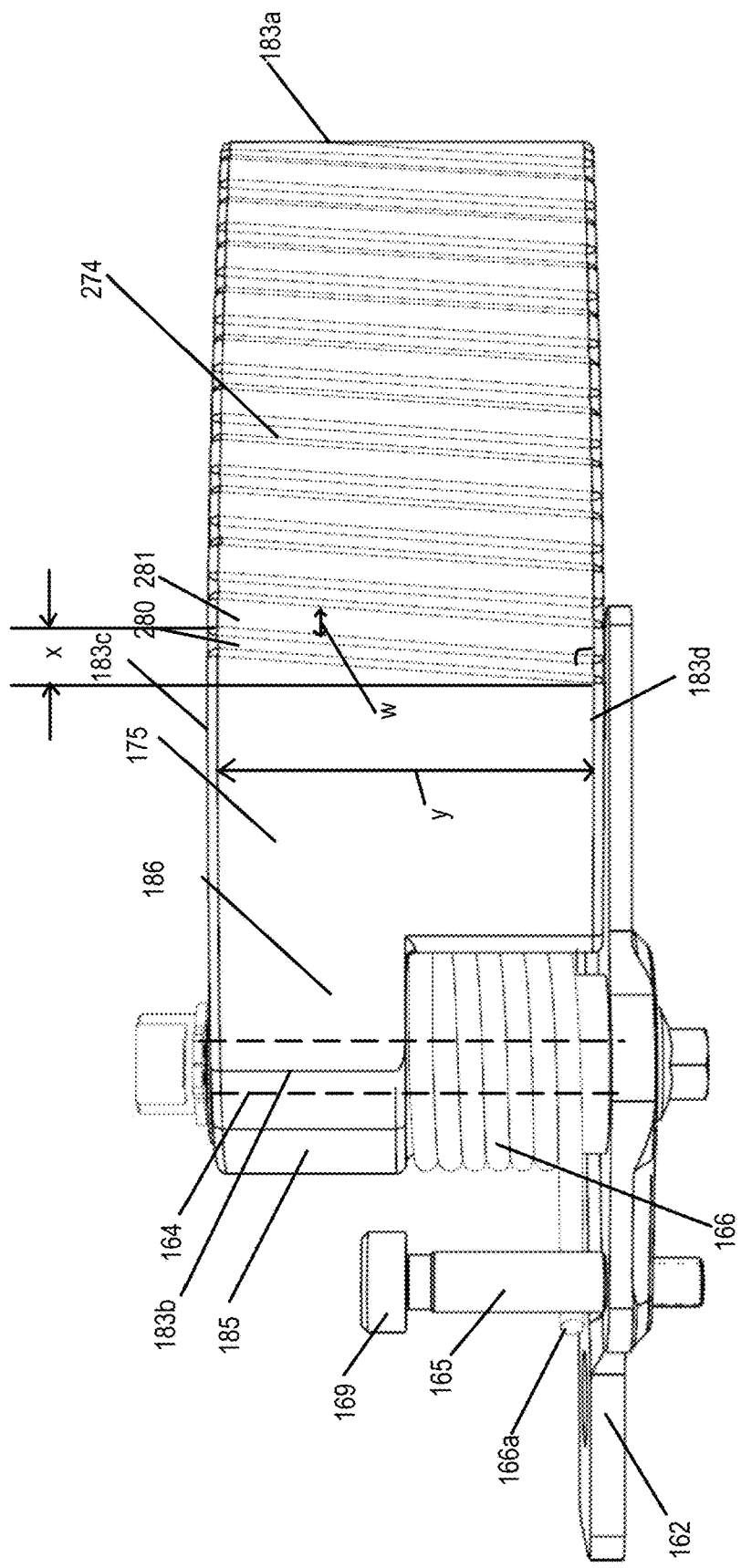
FIG. 6 shows a top view of the tensioner arm with a tensioning face with a pattern including diagonal grooves.

FIGS. 5-6 show a tensioner arm 220 with a tensioning face with a pattern including angled or diagonal grooves.

The pivot axle 164 receives an arm 168 formed of a body 178 having a first end 178a and a second end 178b, a first surface 188 and a second surface 183, opposite the first surface 188. The second surface 183 is defined by a first end 183a, a second end 183b, a first side 183c, a second side 183d and an arcuate boss portion 185. The second surface 183 includes, from a first end 178a to a second end 178b, a chain sliding surface 274, a non-engagement surface 175, and a boss portion 185. The chain sliding surface 274 has a unique pattern of grooves 280 and spacers 281 which engage with or interact with the backs 5 of the chain links 7 of each of the chain strands 8a, 8b. The pattern includes a plurality of radial grooves 280 separated by a spacer 281 of a width w. The unique pattern and associated groove pattern spacing is preferably calculated using equation 1.1 and 1.2. In this embodiment, the width w of the spacer 281 is constant through the pattern. The grooves 280 extend between the first and the second side 183c, 183d and are angled, such that the grooves 280 are not at 90 degrees relative to the first side 183c or the second side 183d. The minimum angle allows for the entire chain width to pass over a given groove during its contact with the tensioner. This angle can be calculated from the tensioner contact length (x) and the width of the chain (y) as $\tan^{-1}(y/x)$. The number of grooves 280 and spacers 281 can vary. The width (w) of the spacers 281 spacing the grooves 280 apart and the number of grooves 280 intentionally break up the chain contact force between the back 5 of the chain links 7 of the chain strand 8a, 8b and the chain sliding face 174 of the tensioner arm 168 to prevent alignment with the chain related orders which are causing NVH within the chain system.

The non-engagement portion 175 of the second surface 181 does not engage with the chain strands 8a, 8b and extends into the boss portion 185 which defines a hole 186 for rotatably receiving the pivot axle 164.

A stop 169 is present on the shaft 165 which can interact with the boss portion 185 of the arm 168 if the arm 168 pivots too far.

Figure 11:
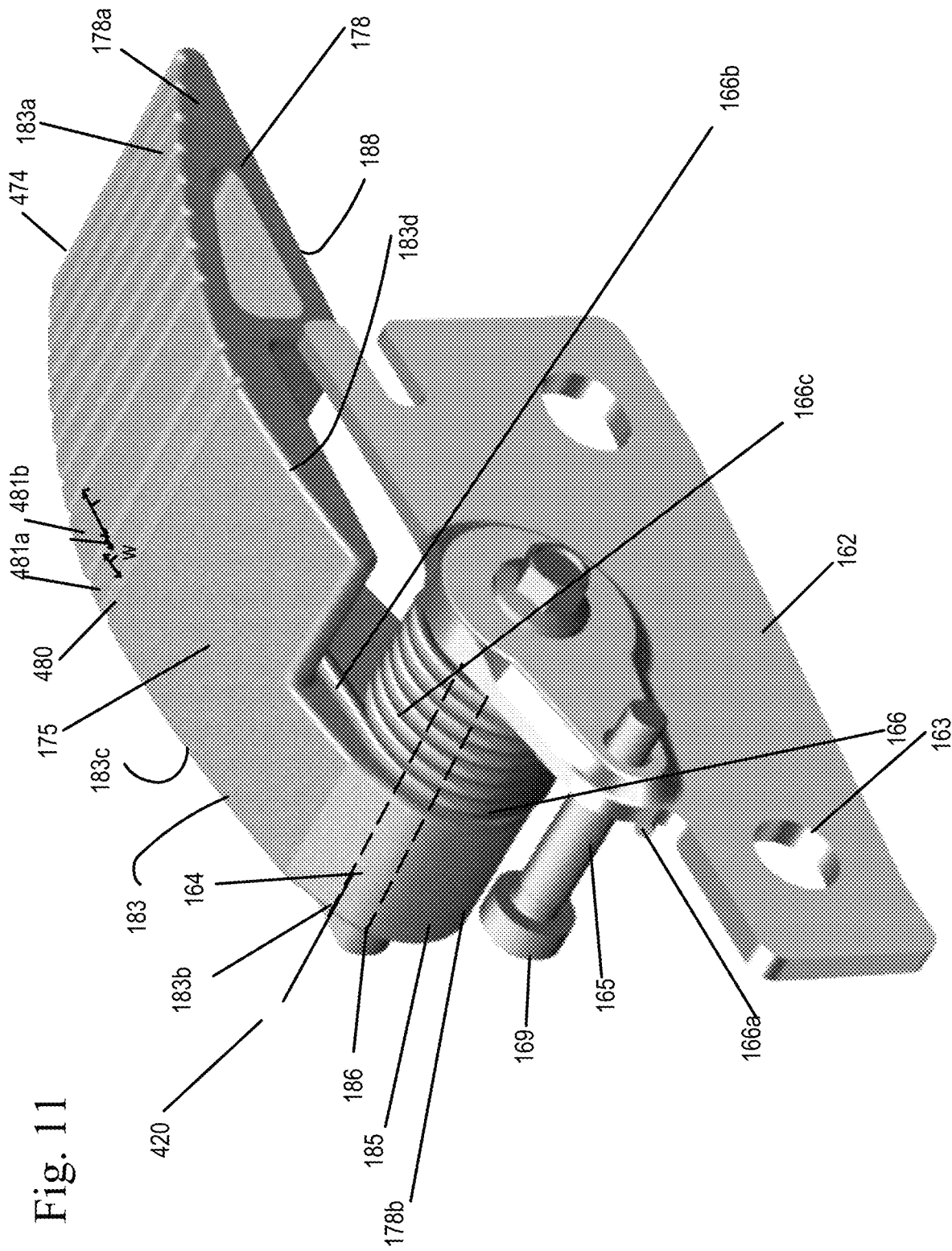
FIG. 11 shows a perspective view of a tensioner arm with a pattern including variable spacing.
Figure 12:
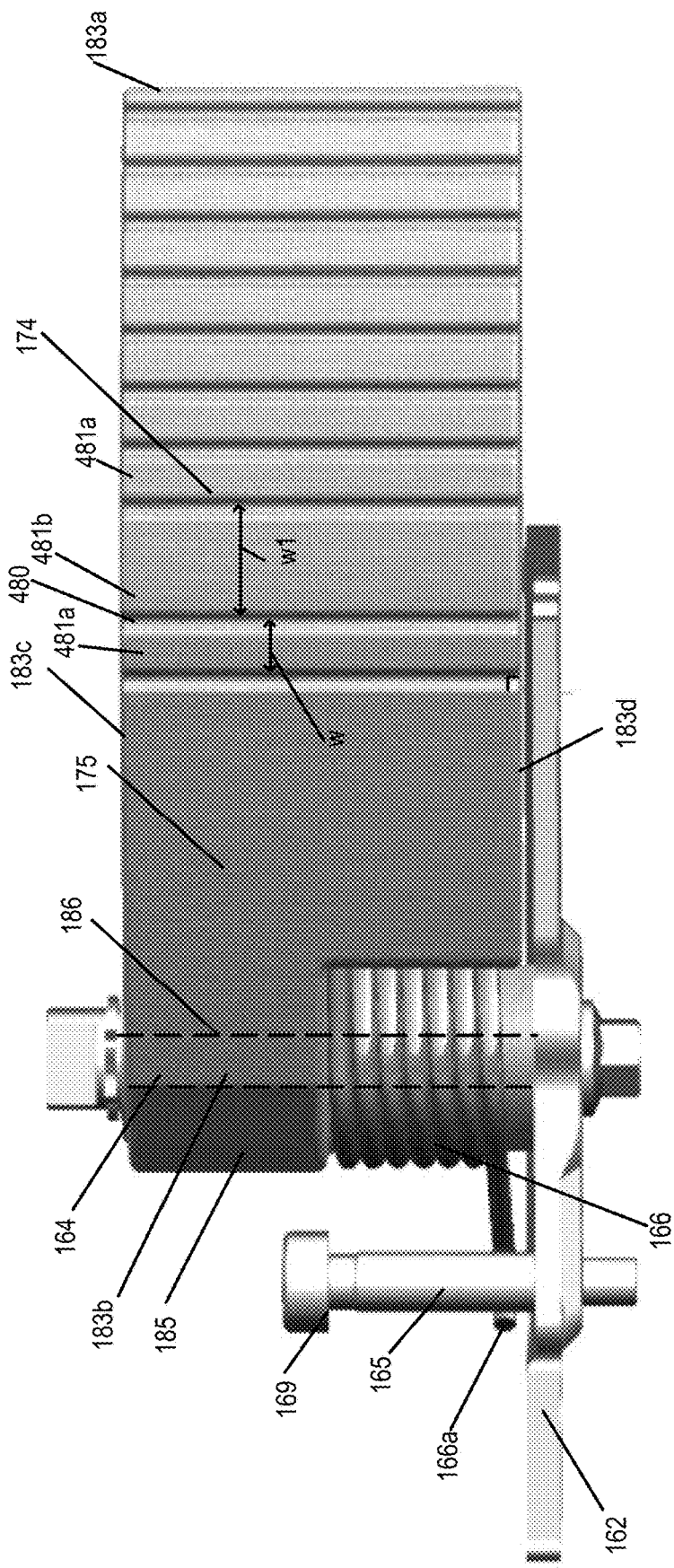
FIG. 12 shows a top view of the tensioner arm with a pattern including variable spacing.

FIGS. 11-12 show an alternate tensioner arm 420 with a tensioning face with a pattern including straight grooves. In this embodiment, the width of the spacers 481a, 481b between the plurality of grooves 480 of the chain sliding face 474 varies within the pattern. For example, in the pattern shown, at least one spacer 481b has a width w1, which is greater than a width w of the other spacers 481a of the pattern. The grooves 480 extend between the first and the second sides 183c, 183d and are straight, such that the grooves 480 are at a right angle relative to the first side or the second side 183c, 183d of the second surface 183 of the tensioner arm 420.

Figure 13:
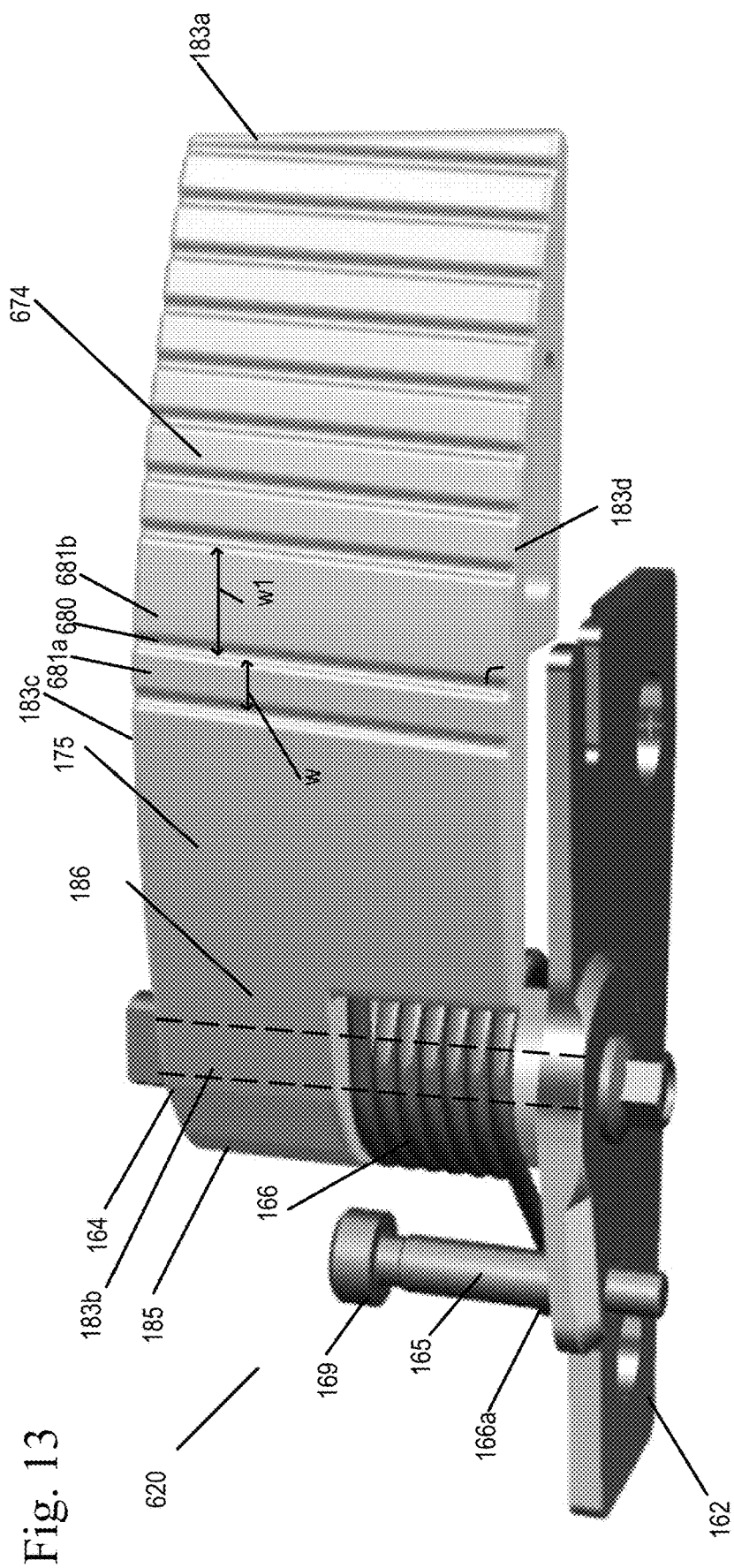
FIG. 13 shows a top view of the tensioner arm with a pattern including variable spacing and diagonal grooves.

FIG. 13 shows an alternate tensioner arm 620 with a tensioning face 674 with a pattern including diagonal or angled grooves. In this embodiment, the width of the spacers between the plurality of grooves of the chain sliding face varies within the pattern. For example, in the pattern shown, at least one spacer 681b has a width w1 which is greater than width w of the other spacers 681a of the pattern. The grooves 680 extend between the first and second side 183c, 183d and are angled, such that the grooves 680 are at an angle of less than 90 degrees relative to the first side 183c or the second side 183d.

FIG. 14 shows a flow diagram of a method of applying a unique pattern to a face of a tensioner arm, guide or snubber to alter the NVH.

In a first step, chain related orders at which NVH occurs within the chain system are determined (step 502). The chain related orders can be determined through computer simulation or through testing of the chain system itself.

Based on the determined chain related orders which cause NVH issues, a pattern is created for application to the face of the tensioner arm, guide or snubber of a plurality of grooves and spacers (step 506). The specific geometry of the grooves can be determined through simulation, testing, or a combination thereof. This process is iterative through experimentation. Groove geometry should be selected to avoid diminishing that lines up with known chain related orders as identified in equations 1.1. and 1.2.

The pattern is then applied to chain sliding face of the tensioner arm, guide or snubber (step 508) and the method ends.

In FIGS. 8-10, it was determined that a chain system had known NVH concerns at half pitch and twice pitch frequencies. Two tensioner face geometries were analyzed and found to have worse performance when the groove geometry was at 0.5×pitch, but better performance at 0.4×pitch.

Figure 7:
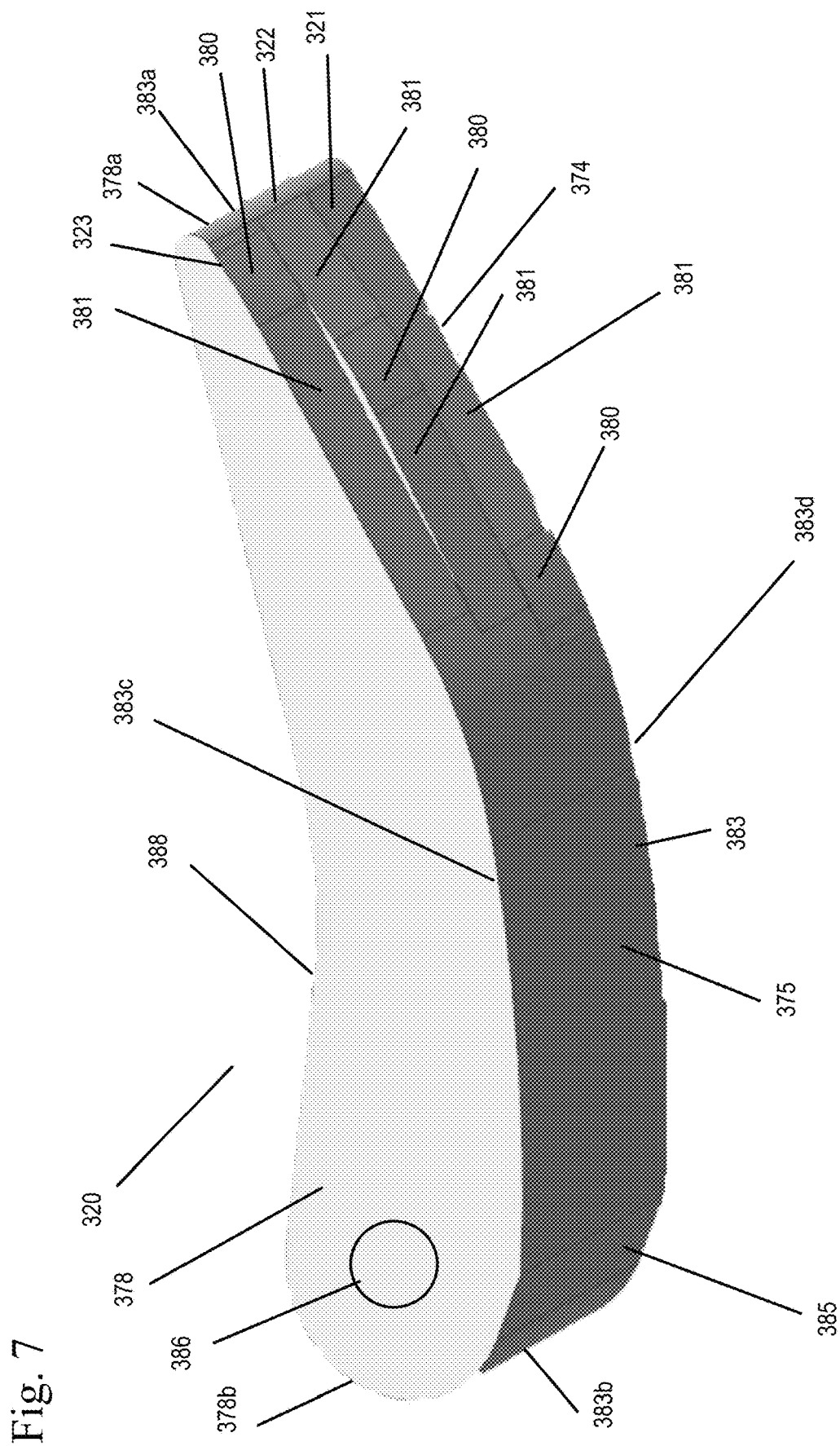
FIG. 7 shows a perspective view of a tensioner arm with different axial chain paths.

FIG. 7 shows another embodiment of a perspective view of a tensioner arm 320 with different axial chain paths 321, 322, 323 each formed of protrusions 380, similar to spacers in other embodiments, depressions 381 similar to the grooves in other embodiments contacting the backs of the links of the chain strand 8a, 8b. In this embodiment, the arm 320 replaces arms of the other embodiments and is attached to the pivot axle 164 of a bracket 162 via hole 386. The arm 320 is formed of a body 378 having a first end 378a and a second end 378b, a first surface 388 and a second surface 383, opposite the first surface 388. The second surface 383 is defined by a first end 383a, a second end 383b, a first side 383c, a second side 383d and an arcuate boss portion 385. The second surface 383 includes, from a first end 378a to a second end 378b, a chain sliding surface 374, a non-engagement surface 375, and a boss portion 385. The chain sliding surface 374 has a unique pattern of protrusions 380 and depressions 381, with the raised portions 380 being present in different areas of the axial chain paths 321, 322, 323 to alter where the backs 5 of the chain links 7 interact with the tensioner arm 320.

Instead of having grooves and spacers that extend between the sides of the chain sliding face, extending from first side 383c to the second side 383d of the second surface 383 of the arm 320 are three different axial paths. Each axial path has a series of protrusions and depressions placed at different points, such that the chain contacts different protrusions and retrusions of each axial path as the tensioner tensions the chain strand. The protrusions and depressions are placed such that the chain related orders are broken up, similar to grooved embodiments discussed above. Again, dimensionality of these protrusions are governed by equations 1.1 and 1.2.

The examples of a pattern for application to the chain sliding face are shown as being applied to a tensioner arm, but could also be applied to the chain sliding face of a guide or snubber without deviating from the scope of the invention.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A method of decreasing noise, vibration and harshness within a chain system comprising:
    determining chain related orders at which noise, vibration and harshness occurs within the chain system;
    determine which chain related orders at which noise, vibration and harshness were determined to occur to avoid increasing;
    creating a pattern for application to a face of a tensioner, guide or snubber comprising a plurality of grooves separated by spacers having a width, with the plurality of grooves and spacers at an angle relative to first and second edges of the face, wherein the pattern includes a pattern engagement dimension that does not equal a multiple of pitch and an integer or a multiple of pitch and 1 over an integer, such that the face of the tensioner, guide or snubber engages with a chain of the chain system of at least one chain order other than the chain related orders at which noise, vibration and harshness were determined to occur to avoid increasing; and
    applying the pattern to the face of the tensioner, guide or snubber.

2. The method of claim 1, wherein the angle is 90 degrees.

3. The method of claim 1, wherein the angle not more than 90 degrees.

4. The method of claim 1, wherein the width of the spacers is constant within the pattern.

5. The method of claim 1, wherein the width of the spacers varies within the pattern.

6. The method of claim 1, wherein the grooves are radial across the face of the tensioner, guide or snubber.

7. The method of claim 1, wherein the grooves extend axially across the face of the tensioner, guide or snubber.

8. The method of claim 7, wherein the grooves each form an axial chain path.

\* \* \* \* \*